United States Patent
Zhou et al.

(10) Patent No.: US 10,186,616 B2
(45) Date of Patent: Jan. 22, 2019

(54) THIN FILM TRANSISTOR AND METHOD FOR MANUFACTURING THE SAME, THIN FILM TRANSISTOR ASSEMBLY, ARRAY SUBSTRATE AND DISPLAY APPARATUS

(71) Applicants: BOE Technology Group Co., Ltd., Beijing (CN); Hefei BOE Optoelectronics Technology Co., Ltd., Anhui (CN)

(72) Inventors: Qinggao Zhou, Beijing (CN); Peng Li, Beijing (CN); Zhong Feng, Beijing (CN); Panpan Meng, Beijing (CN); Zuhong Liu, Beijing (CN); Daeoh Oh, Beijing (CN); Zhi Hou, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/129,969

(22) PCT Filed: May 22, 2015

(86) PCT No.: PCT/CN2015/079578
§ 371 (c)(1),
(2) Date: Sep. 28, 2016

(87) PCT Pub. No.: WO2016/095430
PCT Pub. Date: Jun. 23, 2016

(65) Prior Publication Data
US 2017/0194482 A1    Jul. 6, 2017

(30) Foreign Application Priority Data
Dec. 19, 2014 (CN) .......................... 2014 1 0796010

(51) Int. Cl.
*H01L 29/786* (2006.01)
*H01L 27/02* (2006.01)
(Continued)

(52) U.S. Cl.
CPC ............ *H01L 29/786* (2013.01); *H01L 27/02* (2013.01); *H01L 27/124* (2013.01);
(Continued)

(58) Field of Classification Search
CPC ....... H01L 2924/00; H01L 2224/83191; H01L 27/3262; H01L 2924/0781; H01L 2924/14;
(Continued)

(56) References Cited

U.S. PATENT DOCUMENTS

| 8,907,348 | B2 * | 12/2014 | Miyairi | ............... H01L 27/1225 257/258 |
| 2002/0117691 | A1 * | 8/2002 | Choi | ................. G02F 1/136227 257/225 |

(Continued)

FOREIGN PATENT DOCUMENTS

| CN | 103700708 | 4/2014 |
| JP | 2013033945 | 2/2013 |
| TW | 478469 | 3/2002 |

OTHER PUBLICATIONS

Office Action from Chinese Patent Application No. 201410796010.0, dated Oct. 21, 2016.
(Continued)

*Primary Examiner* — Kyoung Lee
(74) *Attorney, Agent, or Firm* — Westman, Champlin & Koehler, P.A.

(57) ABSTRACT

The present disclosure provides a thin film transistor, a method for manufacturing the same, a thin film transistor assembly, an array substrate and a display apparatus. The
(Continued)

thin film transistor comprises: a substrate; a gate electrode, a gate insulation portion, a semiconductor portion, a source electrode and a drain electrode, the gate insulation portion separating the semiconductor portion from the gate electrode, and the source electrode and the drain electrode being connected to the semiconductor portion, wherein a projection of the gate electrode onto the substrate and that of the semiconductor portion onto the substrate are not overlapped with each other.

20 Claims, 5 Drawing Sheets

(51) Int. Cl.
      *H01L 29/423*       (2006.01)
      *H01L 29/66*        (2006.01)
      *H01L 29/417*       (2006.01)
      *H01L 27/12*        (2006.01)

(52) U.S. Cl.
    CPC .... *H01L 29/41733* (2013.01); *H01L 29/4232* (2013.01); *H01L 29/42384* (2013.01); *H01L 29/66742* (2013.01)

(58) Field of Classification Search
    CPC ............... H01L 29/458; H01L 29/4908; H01L 27/1251; H01L 29/42384
    See application file for complete search history.

(56) References Cited

U.S. PATENT DOCUMENTS

| | | | |
|---|---|---|---|
| 2006/0110863 A1* | 5/2006 | Yamamoto | H01L 21/02532 438/149 |
| 2008/0001154 A1* | 1/2008 | Lee | H01L 27/1214 257/59 |
| 2008/0186422 A1* | 8/2008 | Ishii | G02F 1/136209 349/44 |
| 2012/0064678 A1 | 3/2012 | Lee et al. | |
| 2012/0161138 A1* | 6/2012 | Okumoto | H01L 29/66742 257/59 |
| 2013/0222219 A1* | 8/2013 | Saitoh | H01L 27/1222 345/89 |

OTHER PUBLICATIONS

International Search Report and Written Opinion, for International Application No. PCT/CN2015/079578, dated Sep. 30, 2015.
English translation of Box No. V of the Written Opinion, for International Application No. PCT/CN2015/079578, dated Sep. 30, 2015.
Second Office Action for Chinese Patent Application No. 201410796010.0, dated Jun. 13, 2017, 9 pages.
Third Office Action for Chinese Patent Application No. 201410796010.0, dated Jan. 24, 2018, 10 pages.

\* cited by examiner

THIN FILM TRANSISTOR AND METHOD FOR MANUFACTURING THE SAME, THIN FILM TRANSISTOR ASSEMBLY, ARRAY SUBSTRATE AND DISPLAY APPARATUS

CROSS-REFERENCE TO RELATED APPLICATION

This application is a Section 371 National Stage Application of International Application No. PCT/CN2015/079578, filed May 22, 2015, which published as WO 2016/095430 on Jun. 23, 2016 and which claims priority to Chinese Application No. 201410796010.0, filed with SIPO on Dec. 19, 2014, incorporated herein by reference in their entirety.

BACKGROUND OF THE DISCLOSURE

Field of the Disclosure

The present disclosure relates to the technical field of display, and in particular, to a thin film transistor, a method for manufacturing the thin film transistor, a thin film transistor assembly, an array substrate and a display apparatus.

Description of the Related Art

In a TFT-LCD, it is desired to use a thin film transistor (TFT). The TFT is formed by such as a gate electrode, a source electrode, a drain electrode, an active layer. The TFT is controlled by the gate electrode to act as a switch. It generates variation in voltage of capacitances by data electrical signals inputted from the external so as to drive liquid crystal molecules to deflect to display a picture or image on a screen.

In the prior art, the process for manufacturing the TFT-LCD typically includes the following flows: forming a gate layer (metal layer) on a substrate, then forming a gate insulation layer, forming a semiconductor layer (for example using α-Si) on the gate insulation layer, forming a source and drain layer (metal layer) on the semiconductor layer, forming a passivation layer on the source and drain layer, and finally forming a pixel electrode layer.

In the TFT manufactured by the above process, in some locations, up to six layers may be provided while in other locations, only two layers are provided. Thus, a large step difference may be caused and lines may tend to crack.

SUMMARY

An object of the present application is to reduce the number of layers in a TFT so as to reduce defects of disconnection in lines caused by large step difference during manufacturing the TFT.

In view of the above, technical solutions of embodiments of the present application are provided as follows.

In accordance with an aspect of embodiments of the present application, it provides a thin film transistor, comprising: a substrate; a gate electrode, a gate insulation portion, a semiconductor portion, a source electrode and a drain electrode, the gate insulation portion separating the semiconductor portion from the gate electrode, and the source electrode and the drain electrode being connected to the semiconductor portion, wherein a projection of the gate electrode onto the substrate and that of the semiconductor portion onto the substrate are not overlapped with each other.

In an embodiment, each of the source electrode, the drain electrode and the gate electrode has a part exposed to an outside of the passivation layer; the source connection portion is electrically connected to the source electrode on the outside of the passivation layer, the drain connection portion is electrically connected to the drain electrode on the outside of the passivation layer and the gate connection portion is electrically connected to the gate electrode on the outside of the passivation layer.

In an embodiment, the gate electrode, the gate insulation portion, the semiconductor portion, the source electrode and the drain electrode are arranged in a same layer.

Or in an alternative embodiment, a part of the gate insulation portion is provided between the substrate and the layer in which the semiconductor portion, the source electrode and the drain electrode; and the gate electrode is provided directly on the substrate.

Or in an alternative embodiment, the thin film transistor further including: a passivation layer and the gate electrode, the source electrode, the drain electrode, the gate insulation portion and the semiconductor portion are arranged between the substrate and the passivation layer.

In accordance with another aspect of embodiments of the present application, it provides a thin film transistor assembly, including: the above thin film transistor having the passivation layer; and a source connection portion electrically connected to the source electrode, a drain connection portion electrically connected to the drain electrode and a gate connection portion electrically connected to the gate electrode, the source connection portion, the drain connection portion and the gate connection portion being arranged separately.

In an embodiment, each of the source electrode, the drain electrode and the gate electrode has a part exposed to an outside of the passivation layer; the source connection portion is electrically connected to the source electrode on the outside of the passivation layer, the drain connection portion is electrically connected to the drain electrode on the outside of the passivation layer and the gate connection portion is electrically connected to the gate electrode on the outside of the passivation layer.

Or in an alternative embodiment, a first notch, a second notch and a third notch are provided at an edge of the passivation layer to expose the source electrode, the drain electrode and the gate electrode; and the source connection portion is electrically connected to the source electrode through the first notch, and the drain connection portion is electrically connected to the drain electrode through the second notch, and the gate connection portion is electrically connected to the gate electrode through the third notch.

Or in an alternative embodiment, the passivation layer is provided with a first via hole, a second via hole and a third via hole to expose the source electrode, the drain electrode and the gate electrode; and the source connection portion is electrically connected to the source electrode through the first via hole, and the drain connection portion is electrically connected to the drain electrode through the second via hole, and the gate connection portion is electrically connected to the gate electrode through the third via hole, wherein each of the source connection portion, the drain connection portion and the gate connection portion is at least partially arranged on the passivation layer.

In accordance with a further aspect of embodiments of the present application, it provides a method for manufacturing a thin film transistor, the method comprising: providing a substrate; producing a gate electrode, a gate insulation portion, a semiconductor portion, a source electrode and a drain electrode, such that the gate insulation portion separates the semiconductor portion from the gate electrode, and the source electrode and the drain electrode are connected to the semiconductor portion, wherein a projection of the gate electrode onto the substrate and that of the semiconductor portion onto the substrate are not overlapped with each other.

As an example, in the above method, the gate electrode, the gate insulation portion, the semiconductor portion, the source electrode and the drain electrode are arranged in a same layer, and wherein producing a gate electrode, a gate insulation portion, a semiconductor portion, a source electrode and a drain electrode comprises forming the source electrode, the drain electrode and the gate electrode on the substrate by single patterning process.

As an example, in the above method, producing a gate electrode, a gate insulation portion, a semiconductor portion, a source electrode and a drain electrode comprising forming the source electrode, the drain electrode and the semiconductor portion in a same layer.

In a further embodiment, producing a gate electrode, a gate insulation portion, a semiconductor portion, a source electrode and a drain electrode comprises: producing the gate electrode directly on the substrate; and arranging a part of the gate insulation portion between the substrate and the layer in which the semiconductor portion, the source electrode and the drain electrode. Or, producing a gate electrode, a gate insulation portion, a semiconductor portion, a source electrode and a drain electrode comprises: producing the semiconductor portion, the source electrode and the drain electrode in a same layer and directly on the substrate; and arranging a part of the gate insulation portion between the substrate and the layer in which the gate electrode is arranged.

In an embodiment, the method further includes: producing a passivation layer and arranging the gate electrode, the source electrode, the drain electrode, the gate insulation portion and the semiconductor portion between the substrate and the passivation layer. In a further embodiment, the method further includes: producing notches or via holes on the passivation layer to expose the source electrode, the drain electrode and the gate electrode respectively.

In accordance with a further aspect of embodiments of the present application, it provides an array substrate, including: the thin film transistor as described above; data lines and gate lines; and a pixel electrode, wherein the data lines and the gate lines are electrically connected to the corresponding source electrode and gate electrode respectively; and the pixel electrode is electrically connected to the corresponding drain electrode.

In accordance with a further aspect of embodiments of the present application, it provides a display apparatus including the array substrate as described above.

DETAILED DESCRIPTION OF EMBODIMENTS

The exemplified embodiments of the present application will be described below in details. Examples of these embodiments are shown in figures, in which same or similar reference numerals indicate same or similar elements. The following embodiments described with reference to figures are given by ways of examples, and only intended to explain the present application instead of limiting the present application.

In accordance with a general concept of the present application, it provides a thin film transistor, including: a substrate; a gate electrode, a gate insulation portion, a semiconductor portion, a source electrode and a drain electrode, the gate insulation portion separating the semiconductor portion from the gate electrode, and the source electrode and the drain electrode being connected to the semiconductor portion, wherein a projection of the gate electrode onto the substrate and that of the semiconductor portion onto the substrate are not overlapped with each other.

In addition, for the purpose of explanation, numerous specific details are set forth in the following detailed description to provide a thorough understanding to the embodiments of the present invention. It is obvious, however, that one or more embodiments can also be implemented without these specific details. In other instances, well-known structures and devices are shown in an illustrative manner so as to simplify the drawings.

In the prior art, a gate insulation portion is provided on the gate electrode 4, and a semiconductor layer is then arranged on the gate insulation portion and the semiconductor layer is desired to face the gate electrode. In this way, the gate electrode, the gate insulation portion and the semiconductor layer have constituted three layers. However, the number of layers in the TFT may be reduced by preventing a projection of the gate electrode onto the substrate and that of the semiconductor layer onto the substrate from being overlapped with each other.

With reference to FIGS. 1-9, a method for manufacturing a thin film transistor according to an exemplified embodiment of the present application.

Figure 1:
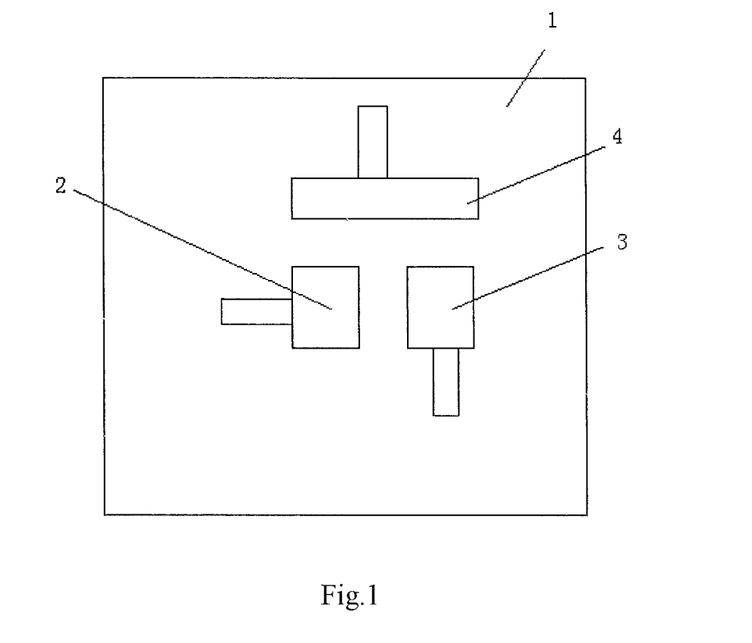
FIGS. 1-6 are schematic views showing a process for manufacturing a thin film transistor according to an exemplified embodiment of the present application.
Figure 2:
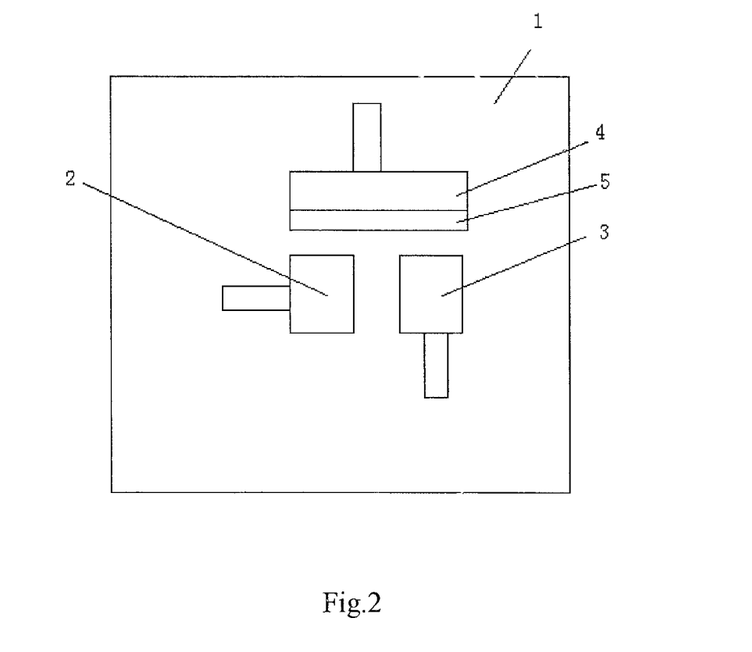
Figure 3:
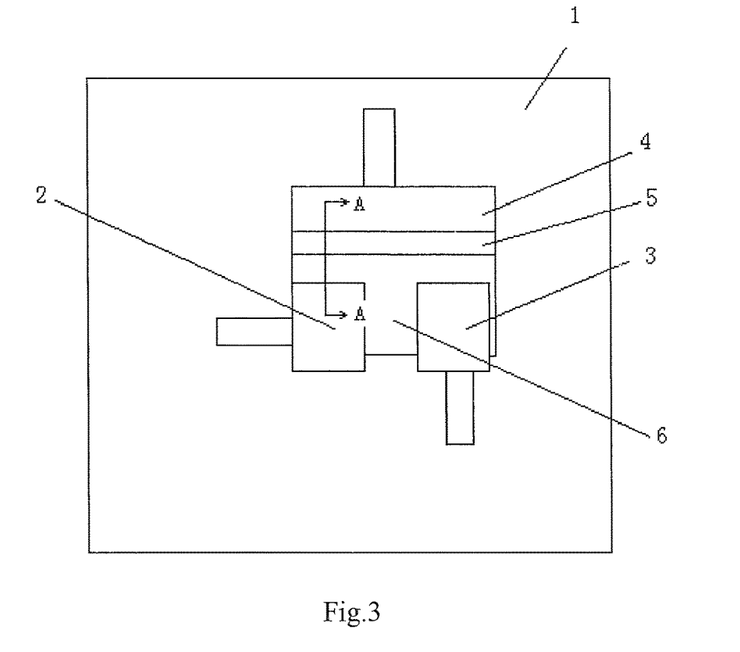
Figure 4:
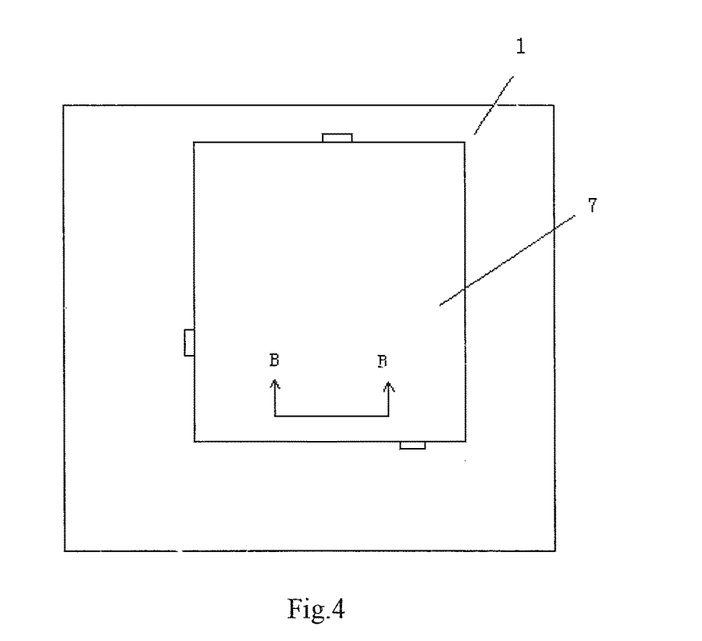
Figure 5:
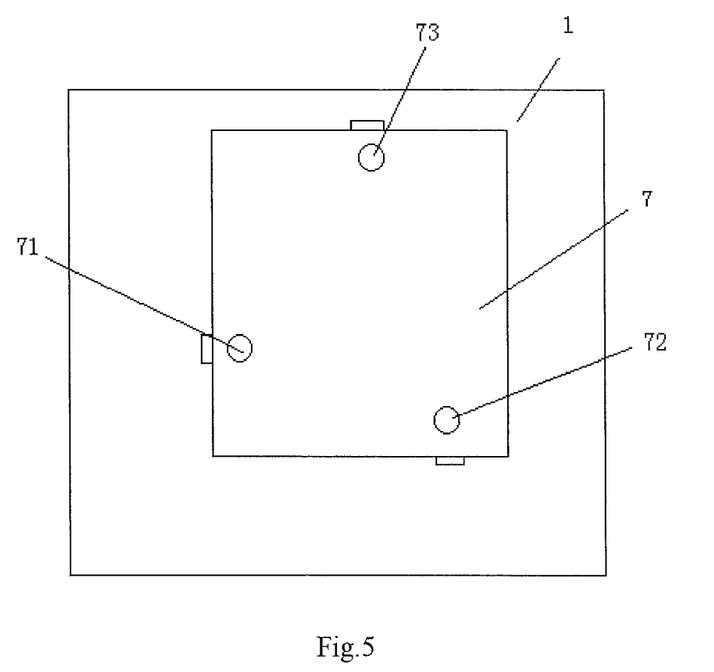
Figure 7:
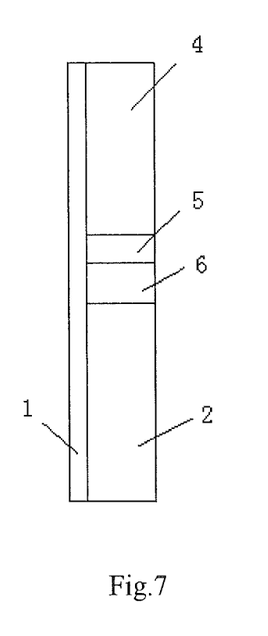
FIG. 7 is a partial sectional schematic view taken at line A-A shown in FIG. 3.
Figure 8:
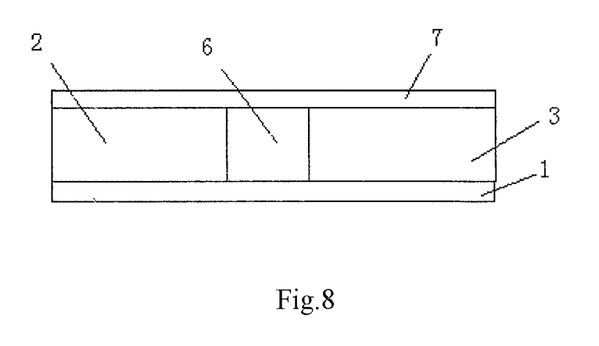
FIG. 8 is a partial sectional schematic view taken at line B-B shown in FIG. 4.

As shown in FIGS. 1-9, the method for manufacturing a thin film transistor according to an exemplified embodiment of the present application includes the following steps:

providing a substrate 1;

as shown in FIG. 1, forming a source electrode 2, a drain electrode 3 and a gate electrode 4 on the substrate 1 by a patterning process, the source electrode 2, the drain electrode 3 and the gate electrode 4 being arranged in a same layer;

as shown in FIG. 2, forming a gate insulation portion 5 in a layer in which the source electrode 2, the drain electrode 3 and the gate electrode 4 are arranged, the gate insulation portion 5 electrically insulating each of the source electrode, the drain electrode and the gate electrode from the two;

as shown in FIG. 3, forming a semiconductor portion 6 in the layer in which the source electrode, the drain electrode, the gate electrode and the gate insulation portion 5 are arranged, wherein the semiconductor portion 6 is separated by the gate insulation portion 5 from the gate electrode 4, as shown in FIG. 7, the gate insulation portion 5 and the semiconductor portion 6 being arranged between the gate electrode 4 and the source electrode 2;

as shown in FIG. 4, forming a passivation layer 7 on the layer in which the source electrode 2, the drain electrode 3, the gate electrode 4, the gate insulation portion 5 and the semiconductor portion 6 are arranged, as shown in FIG. 8, the semiconductor portion 6 being connected between the source electrode 2 and the drain electrode 3 to separate the source electrode 2 from the drain electrode 3 and the passivation layer 7 being formed directly on the layer in which the source electrode 2, the drain electrode 3, the gate electrode 4, the gate insulation portion 5 and the semiconductor portion 6 are arranged to form a double-layer arrangement;

as shown in FIG. 5, forming a first via hole 71, a second via hole 72 and a third via hole 73 in the passivation layer 7 by a patterning process to expose the source electrode 2 from the first via hole 71, to expose the drain electrode 3 from the second via hole 72, and to expose the gate electrode 4 from the third via hole 73 respectively.

Figure 6:
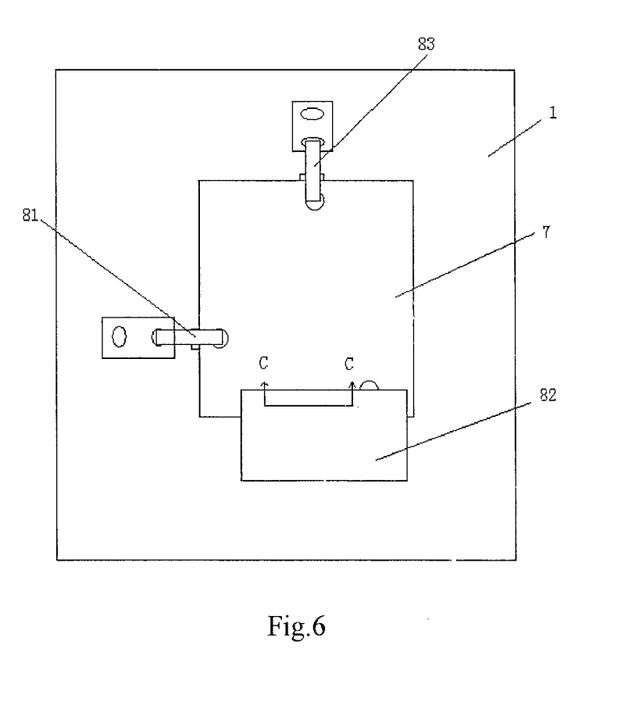
Figure 9:
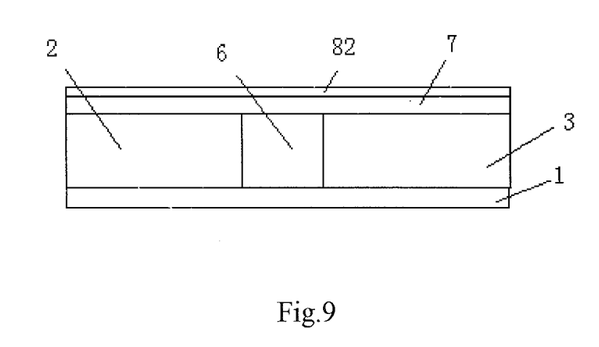
FIG. 9 is a partial sectional schematic view taken at line C-C shown in FIG. 6.

As shown in FIG. 6, a source connection portion 81, a drain connection portion 82 and a gate connection portion 83 are formed by a patterning process such that the source connection portion 81, the drain connection portion 82 and the gate connection portion 83 are electrically connected to the source electrode 2, the drain electrode 3 and the gate electrode 4 respectively. As shown in FIG. 9, the drain connection portion 82 is formed on the passivation layer 7 to form a three-layer arrangement. In FIG. 6, the drain connection portion 82 corresponds to a pixel electrode.

In the above process, the step of, forming the semiconductor portion and the step of forming the gate insulation portion may be swapped as long as the relative positions of the semiconductor portion, the gate insulation portion, the gate electrode, the source electrode and the drain electrode meet the requirements.

Patterns of the source electrode, the drain electrode and the gate electrode may be formed on the substrate by a single patterning process.

In the above process, the first via hole 71, the second via hole 72 and the third via hole 73 are formed in the passivation layer 7 so as to connect the source electrode 2, the drain electrode 3 and the gate electrode 4. However, in case that the passivation layer has not covered all of the source electrode, the drain electrode and the gate electrode completely, i.e., each of the drain electrode, the source electrode and the gate electrode has a part exposed to an outside of the passivation layer, all of the source connection portion, the drain connection portion and the gate connection portion may be arranged at outside of the passivation layer, i.e., the source connection portion, the drain connection portion and the gate connection portion have not any parts on the passivation layer. As an example, although not shown, the step for forming the passivation layer further includes forming a first notch, a second notch and a third notch at an edge of the passivation layer to expose the source electrode, the drain electrode and the gate electrode respectively. And the step of forming the source connection portion, the drain connection portion and the gate connection portion may include connecting the source connection portion with the source electrode through the first notch, connecting the drain connection portion with the drain electrode through the second notch, and connecting the gate connection portion with the gate electrode through the third notch. Similarly, at that time, the source connection portion, the drain connection portion and the gate connection portion may not have any parts arranged on the passivation layer.

In the above specific embodiments, the gate electrode 4, the gate insulation portion 5, the semiconductor portion 6, the source electrode 2 and the drain electrode 3 are arranged in a same layer. In the case that the passivation layer 7 is not present, the TFT has only one layer. Even if the passivation layer 7 is present, the TFT may also have only two layers. In comparison with the TFT in the prior art, the number of layers in the resultant TFT may be reduced.

The gate electrode 4, the gate insulation portion 5, the semiconductor portion 6, the source electrode 3 and the drain electrode 3 may also not be arranged in the same layer.

Figure 10:
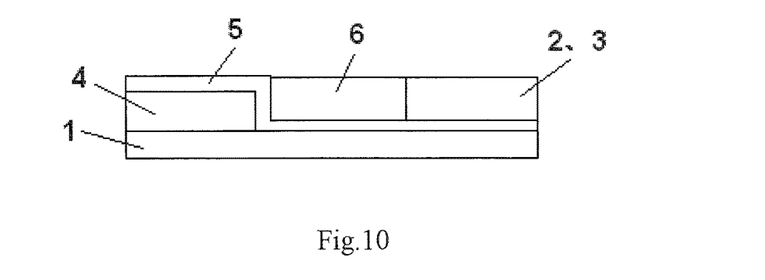
FIG. 10 is a schematic view showing a structure of a thin film transistor according to another exemplified embodiment of the present application.

With reference to FIG. 10, as an example, the semiconductor portion 6, the source electrode 2 and the drain electrode 3 are arranged in the same layer. A part of the gate insulation portion 5 is arranged between the substrate 1 and the layer in which the semiconductor portion 6, the source electrode 2 and the drain electrode 3 are arranged. The gate electrode 4 is arranged directly on the substrate 1. In FIG. 10, the gate insulation portion 5 also covers the gate electrode 4. However, it is not necessary, for example, the gate insulation portion 5 may not cover the gate electrode 4.

In an embodiment of the present application, the phase "arranged directly on the substrate" means "contact in direct with a surface of the substrate". The surface of the substrate may be processed or not be processed.

Figure 11:
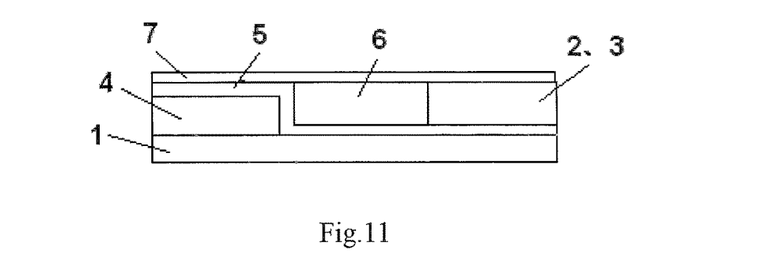
FIG. 11 is a schematic view showing a structure of a thin film transistor according to a further exemplified embodiment of the present application.

The embodiment shown in FIG. 11 is distinguished from that shown in FIG. 10 in that a passivation layer 7 is added. The gate electrode 4, the source electrode 2, the drain electrode 3, the gate insulation portion 5 and the semiconductor portion 6 are arranged between the substrate 1 and the passivation layer 7.

Figure 12:
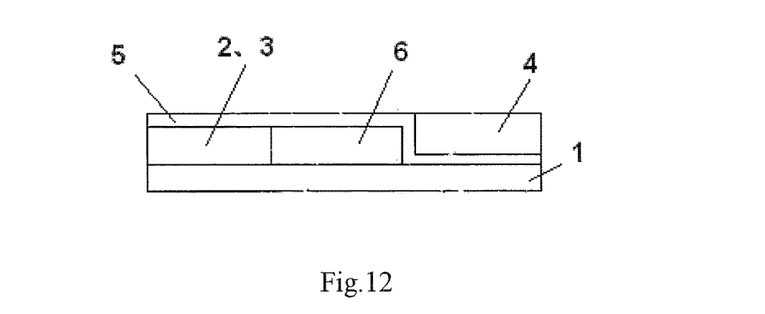
FIG. 12 is a schematic view showing a structure of a thin film transistor according to a yet exemplified embodiment of the present application.

Referring to FIG. 12, the semiconductor portion 6, the source electrode 2 and the drain electrode 3 are arranged in the same layer and directly on the substrate 1. A part of the gate insulation portion 5 is arranged between the substrate and the layer in which the gate electrode 4 is arranged. In FIG. 12, the gate insulation portion 5 also covers the semiconductor portion 6, the source electrode 2 and the drain electrode 3. However, it is not necessary, for example, the gate insulation portion 5 may not cover the semiconductor portion 6, the source electrode 2 and the drain electrode 3.

Figure 13:
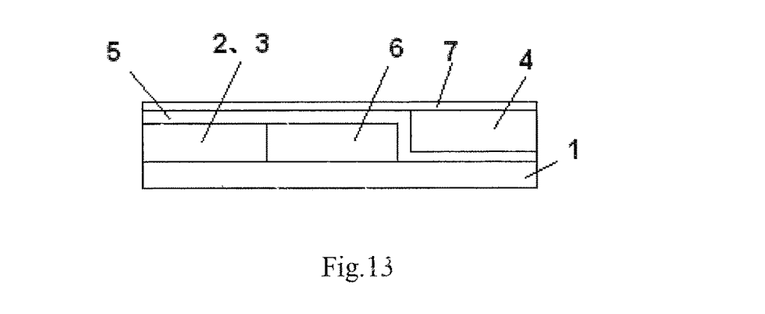
FIG. 13 is a schematic view showing a structure of a thin film transistor according to a yet further exemplified embodiment of the present application.

The embodiment shown in FIG. 13 is distinguished from that shown in FIG. 12 in that a passivation layer 7 is added. The gate electrode 4, the source electrode 2, the drain electrode 3, the gate insulation portion 5 and the semiconductor portion 6 are arranged between the substrate 1 and the passivation layer 7.

As discussed above, an embodiment of the present application provides a thin film transistor, including: a substrate 1; a gate electrode 4, a gate insulation portion 5, a semiconductor portion 6, a source electrode 2 and a drain electrode 3, the gate insulation portion 5 separating the semiconductor portion 6 from the gate electrode 4, and the source electrode 2 and the drain electrode 3 being connected to the semiconductor portion 6, wherein a projection of the gate electrode 4 onto the substrate and that of the semiconductor portion 6 onto the substrate 1 are not overlapped with each other.

As an example, as shown in FIG. 3, the gate electrode 4, the gate insulation portion 5, the semiconductor portion 6, the source electrode 2 and the drain electrode 3 are arranged in a same layer.

As an example, as shown in FIG. 10, a part of the gate insulation portion 5 is provided between the substrate 1 and the layer in which the semiconductor portion 6, the source electrode and the drain electrode; and the gate electrode 4 is provided directly on the substrate 1.

As an example, as shown in FIG. 12, the semiconductor portion 6, the source electrode and the drain electrode are arranged in a same layer and arranged directly on the substrate 1; and a part of the gate insulation portion is arranged between the substrate and the layer in which the gate electrode is arranged.

As an example, as shown in FIGS. 8-9, 11 and 13, the thin film transistor further includes a passivation layer 7 and the gate electrode 4, the source electrode 2, the drain electrode 3, the gate insulation portion 5 and the semiconductor portion 6 are arranged between the substrate 1 and the passivation layer 7.

For example, as shown in FIG. 6, an embodiment of the present application also provides a thin film transistor assembly, including: the above thin film transistor having the passivation layer 7; and a source connection portion 81, a drain connection portion 82 and a gate connection portion 83 arranged separately. The source connection portion 81 is electrically connected to the source electrode 2. The source connection portion 81 is electrically connected to the drain electrode 3. The gate connection portion 83 is electrically connected to the gate electrode 4.

It should be noted that in the embodiments of the present application, so-called source connection portion 81, drain connection portion 82 and gate connection portion 83 function only to electrically connect the source electrode, the drain electrode and the gate electrode with outside of the TFT. Any components that have such functions may be regarded as the connection portion. For example, when the gate electrode is directly connected with gate lines, the gate lines themselves may be used as the gate connection portion. Again for example, the gate lines may be electrically connected to the gate electrode through via holes. In this example, the connection body in the via holes may constitute the gate connection portion.

An embodiment of the present application provides a method for manufacturing a thin film transistor, the method including: providing a substrate 1; and producing a gate electrode 4, a gate insulation portion 5, a semiconductor portion 6, a source electrode 2 and a drain electrode 3, such that the gate insulation portion 5 separates the semiconductor portion 6 from the gate electrode 4, and the source electrode 2 and the drain electrode 3 are connected to the semiconductor portion 6, and a projection of the gate electrode 4 onto the substrate 1 and that of the semiconductor portion 6 onto the substrate 1 are not overlapped with each other.

In an example, in the above method, as shown in FIG. 3, the gate electrode 4, the gate insulation portion 5, the semiconductor portion 6, the source electrode 2 and the drain electrode 3 are arranged in a same layer, and the step of "producing a gate electrode, a gate insulation portion, a semiconductor portion, a source electrode and a drain electrode" includes: forming the source electrode, the drain electrode and the gate electrode on the substrate by single patterning process.

In an example, in the above method, as shown in FIGS. 10-13, the step of "producing a gate electrode 4, a gate insulation portion 5, a semiconductor portion 6, a source electrode 2 and a drain electrode 3" includes: forming the source electrode 2, the drain electrode 3 and the semiconductor portion 6 in a same layer. In a further example, as shown in FIG. 10, the step of "producing a gate electrode 4, a gate insulation portion 5, a semiconductor portion 6, a source electrode 2 and a drain electrode 3" includes: producing the gate electrode 4 directly on the substrate 1; and arranging a part of the gate insulation portion 5 between the substrate 1 and the layer in which the semiconductor portion 6, the source electrode and the drain electrode. Or, as shown in FIG. 12, the step of "producing a gate electrode 4, a gate insulation portion 5, a semiconductor portion 6, a source electrode 2 and a drain electrode 3" includes: producing the semiconductor portion 6, the source electrode and the drain electrode in a same layer and directly on the substrate 1; and arranging a part of the gate insulation portion 5 between the substrate 1 and the layer in which the gate electrode 4 is arranged.

In an example, the method further includes: producing a passivation layer 7, as shown in FIGS. 11, 13 and arranging the gate electrode 4, the source electrode 2, the drain electrode 3, the gate insulation portion 5 and the semiconductor portion 6 between the substrate 1 and the passivation layer 7. In a further example, the method further includes: producing notches or via holes on the passivation layer 7 to expose the source electrode, the drain electrode and the gate electrode respectively.

The TFT provided by the present application may achieve its functions by processes of at most 3 layers and at least 2 layers, so as to reduce the defects of disconnection in lines caused by large step difference.

In the present application, it should be noted that, in order to ensure good contact between two members that need surface contact, the contact surfaces with convex-concave matching shapes may be formed to enhance the contact area.

The TFT according to embodiments of the present application may be used in such as LCD, LED, AMOLED, TN, ADS display applications.

An embodiment of the present application also provides an array substrate, including: the thin film transistor as described in any one of the above embodiments; data lines and gate lines; and a pixel electrode, wherein the data lines and the gate lines are electrically connected to the corresponding source electrode and gate electrode respectively; and the pixel electrode is electrically connected to the corresponding drain electrode.

An embodiment of the present application also provides a display apparatus including the array substrate as described above. The display apparatus may be any apparatuses that may display images, such as liquid crystal display panel.

The above embodiments are only examples of the present application. It would be appreciated that those skilled in the art may make various modifications or alternations of the above embodiments within the scope of the present disclosure. The scope of the present application is defined by the appended claims.

What is claimed is:
1. A thin film transistor, comprising:
 a substrate;
 a gate electrode, a gate insulation portion, a semiconductor portion, a source electrode and a drain electrode, the gate insulation portion separating the semiconductor portion from the gate electrode, and the source electrode and the drain electrode being connected to the semiconductor portion, wherein a projection of the gate electrode onto the substrate and projections of any parts of the semiconductor portion onto the substrate are not overlapped with each other, and wherein the semiconductor portion is connected between the source electrode and the drain electrode to separate the source electrode from the drain electrode.

2. The thin film transistor according to claim 1, wherein the gate electrode, the gate insulation portion, the semiconductor portion, the source electrode and the drain electrode are arranged in a same layer.

3. The thin film transistor according to claim 1, wherein the semiconductor portion, the source electrode and the drain electrode are arranged in a same layer and a part of the gate insulation portion is provided between the substrate and the layer in which the semiconductor portion, the source electrode and the drain electrode are arranged; and the gate electrode is provided directly on the substrate.

4. The thin film transistor according to claim 1, wherein the semiconductor portion, the source electrode and the drain electrode are arranged in a same layer and arranged directly on the substrate; and a part of the gate insulation portion is arranged between the substrate and the layer in which the gate electrode is arranged.

5. The thin film transistor according to claim 1, further comprising: a passivation layer and the gate electrode, the source electrode, the drain electrode, the gate insulation portion and the semiconductor portion are arranged between the substrate and the passivation layer.

6. A thin film transistor assembly, comprising:
the thin film transistor according to claim 5; and
a source connection portion electrically connected to the source electrode, a drain connection portion electrically connected to the drain electrode and a gate connection portion electrically connected to the gate electrode, the source connection portion, the drain connection portion and the gate connection portion being arranged separately.

7. The thin film transistor assembly according to claim 6, wherein each of the source electrode, the drain electrode and the gate electrode has a part exposed to an outside of the passivation layer;

the source connection portion, the drain connection portion and the gate connection portion are electrically connected to the source electrode, the drain electrode and the gate electrode on the outside of the passivation layer respectively.

8. The thin film transistor assembly according to claim 6, wherein a first notch, a second notch and a third notch are provided at an edge of the passivation layer to expose the source electrode, the drain electrode and the gate electrode; and the source connection portion is electrically connected to the source electrode through the first notch, and the drain connection portion is electrically connected to the drain electrode through the second notch, and the gate connection portion is electrically connected to the gate electrode through the third notch.

9. The thin film transistor assembly according to claim 6, wherein the passivation layer is provided with a first via hole, a second via hole and a third via hole to expose the source electrode, the drain electrode and the gate electrode; and the source connection portion is electrically connected to the source electrode through the first via hole, and the drain connection portion is electrically connected to the drain electrode through the second via hole, and the gate connection portion is electrically connected to the gate electrode through the third via hole, wherein each of the source connection portion, the drain connection portion and the gate connection portion is at least partially arranged on the passivation layer.

10. A method for manufacturing a thin film transistor according to claim 1, the method comprising:
providing a substrate;
producing a gate electrode, a gate insulation portion, a semiconductor portion, a source electrode and a drain electrode, such that the gate insulation portion separates the semiconductor portion from the gate electrode, and the source electrode and the drain electrode are connected to the semiconductor portion,
wherein a projection of the gate electrode onto the substrate and projections of any parts of the semiconductor portion onto the substrate are not overlapped with each other.

11. The method according to claim 10, wherein the gate electrode, the gate insulation portion, the semiconductor portion, the source electrode and the drain electrode are arranged in a same layer, and wherein producing the gate electrode, gate insulation portion, the semiconductor portion, the source electrode and the drain electrode comprises forming the source electrode, the drain electrode and the gate electrode on the substrate by single patterning process.

12. The method according to claim 10, wherein producing the gate electrode, the gate insulation portion, the semiconductor portion, the source electrode and the drain electrode comprises forming the source electrode, the drain electrode and the semiconductor portion in a same layer.

13. The method according to claim 12, wherein producing the gate electrode, the gate insulation portion, the semiconductor portion, the source electrode and the drain electrode comprises:

producing the gate electrode directly on the substrate; and
arranging a part of the gate insulation portion between the substrate and the layer in which the semiconductor portion, the source electrode and the drain electrode.

14. The method according to claim 12, wherein producing the gate electrode, the gate insulation portion, the semiconductor portion, the source electrode and the drain electrode comprises:

producing the semiconductor portion, the source electrode and the drain electrode in a same layer and directly on the substrate; and
arranging a part of the gate insulation portion between the substrate and the layer in which the gate electrode is arranged.

15. The method according to claim 10, further comprising:
producing a passivation layer and arranging the gate electrode, the source electrode, the drain electrode, the gate insulation portion and the semiconductor portion between the substrate and the passivation layer.

16. The method according to claim 15, further comprising:
producing notches or via holes on the passivation layer to expose the source electrode, the drain electrode and the gate electrode respectively.

17. An array substrate, comprising:
the thin film transistor according to claim 6;
data lines and gate lines; and
a pixel electrode, wherein the data lines and the gate lines are electrically connected to the corresponding source electrode and gate electrode respectively; and the pixel electrode is electrically connected to the corresponding drain electrode.

18. A display apparatus comprising the array substrate according to claim 17.

19. The thin film transistor according to claim 2, further comprising: a passivation layer and the gate electrode, the source electrode, the drain electrode, the gate insulation portion and the semiconductor portion are arranged between the substrate and the passivation layer.

20. The thin film transistor according to claim 3, further comprising: a passivation layer and the gate electrode, the source electrode, the drain electrode, the gate insulation portion and the semiconductor portion are arranged between the substrate and the passivation layer.

* * * * *